(12) United States Patent
Nishida et al.

(10) Patent No.: US 12,123,744 B2
(45) Date of Patent: Oct. 22, 2024

(54) DISTANCE MEASURING DEVICE

(71) Applicant: SONY GROUP CORPORATION, Tokyo (JP)

(72) Inventors: Sho Nishida, Tokyo (JP); Kenta Endo, Tokyo (JP); Kei Nakagawa, Tokyo (JP); Takao Tanikame, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 366 days.

(21) Appl. No.: 17/436,171

(22) PCT Filed: Feb. 12, 2020

(86) PCT No.: PCT/JP2020/005311
§ 371 (c)(1),
(2) Date: Sep. 3, 2021

(87) PCT Pub. No.: WO2020/189101
PCT Pub. Date: Sep. 24, 2020

(65) Prior Publication Data
US 2022/0136826 A1    May 5, 2022

(30) Foreign Application Priority Data

Mar. 18, 2019 (JP) ................. 2019-050071

(51) Int. Cl.
*G01C 3/06* (2006.01)
*G01C 3/08* (2006.01)
(Continued)

(52) U.S. Cl.
CPC .............. *G01C 3/06* (2013.01); *G01S 7/4914* (2013.01); *G01S 7/4915* (2013.01);
(Continued)

(58) Field of Classification Search
CPC ........... G01C 3/06; G01C 3/08; G01S 7/4915; G01S 17/894; G01S 7/4914;
(Continued)

(56) References Cited

U.S. PATENT DOCUMENTS

2015/0008554 A1* 1/2015 Akiyama ................. G02B 6/42
257/432
2017/0038459 A1 2/2017 Kubachki et al.
(Continued)

FOREIGN PATENT DOCUMENTS

CN 104282703 A 1/2015
CN 106104296 A 11/2016
(Continued)

OTHER PUBLICATIONS

English machine translation of JP-2005109370-A (Year: 2005).*
(Continued)

*Primary Examiner* — Dominic J Bologna
(74) *Attorney, Agent, or Firm* — CHIP LAW GROUP

(57) ABSTRACT

A distance measuring device according to the present disclosure includes: a light-receiving section including a first light-receiving pixel and a second light-receiving pixel that are configured to detect light, and a light-shielded pixel that is light-shielded, the first light-receiving pixel, the light-shielded pixel, and the second light-receiving pixel being disposed in a first direction in this order; and a processor that is configured to measure a distance to a measurement object on the basis of a detection result in the first light-receiving pixel and a detection result in the second light-receiving pixel.

12 Claims, 15 Drawing Sheets

(51) Int. Cl.

| | | |
|---|---|---|
| *G01S 7/4914* | (2020.01) | |
| *G01S 7/4915* | (2020.01) | |
| *G01S 17/894* | (2020.01) | |
| *G01S 17/931* | (2020.01) | |
| *H01L 31/0203* | (2014.01) | |
| *H01L 31/0216* | (2014.01) | |
| *H01L 31/0232* | (2014.01) | |
| *H01L 31/107* | (2006.01) | |

(52) U.S. Cl.
 CPC .......... *G01S 17/894* (2020.01); *G01S 17/931* (2020.01); *H01L 31/0203* (2013.01); *H01L 31/02164* (2013.01); *H01L 31/0232* (2013.01); *H01L 31/107* (2013.01); *G01C 3/08* (2013.01)

(58) Field of Classification Search
 CPC ............. G01S 17/931; H01L 31/02164; H01L 31/0232; H01L 31/0203; H01L 31/107
 See application file for complete search history.

(56) References Cited

U.S. PATENT DOCUMENTS

2017/0090018 A1* 3/2017 Buettgen ............... G01S 7/4918
2018/0166487 A1* 6/2018 Noudo ..................... G02B 7/34
2020/0235142 A1* 7/2020 Saito ................. H01L 27/14621
2021/0143196 A1* 5/2021 Uchida ............. H01L 27/14627

FOREIGN PATENT DOCUMENTS

| CN | 110100312 A | | 8/2019 | |
|---|---|---|---|---|
| EP | 3117238 A | | 1/2017 | |
| JP | 2005109370 A | * | 4/2005 | |
| JP | 2015-015296 A | | 1/2015 | |
| JP | 2018-148116 A | | 9/2018 | |
| JP | 2019-029601 A | | 2/2019 | |
| KR | 10-2016-0132962 A | | 11/2016 | |
| KR | 10-2019-0119029 A | | 10/2019 | |
| TW | 201843825 A | | 12/2018 | |
| WO | 2015/136099 A2 | | 9/2015 | |
| WO | 2015/136100 A2 | | 9/2015 | |
| WO | WO-2016194501 A1 | * | 12/2016 | ............... G02B 7/34 |
| WO | 2018/163838 A1 | | 9/2018 | |
| WO | 2019/026393 A1 | | 2/2019 | |

OTHER PUBLICATIONS

International Search Report and Written Opinion of PCT Application No. PCT/JP2020/005311, issued on Mar. 17, 2020, 09 pages of ISRWO.

* cited by examiner

[FIG. 1]
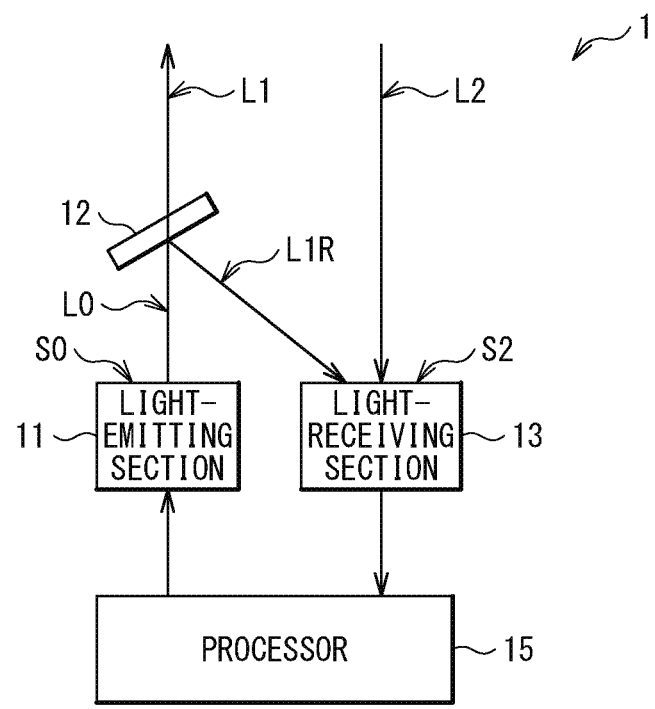

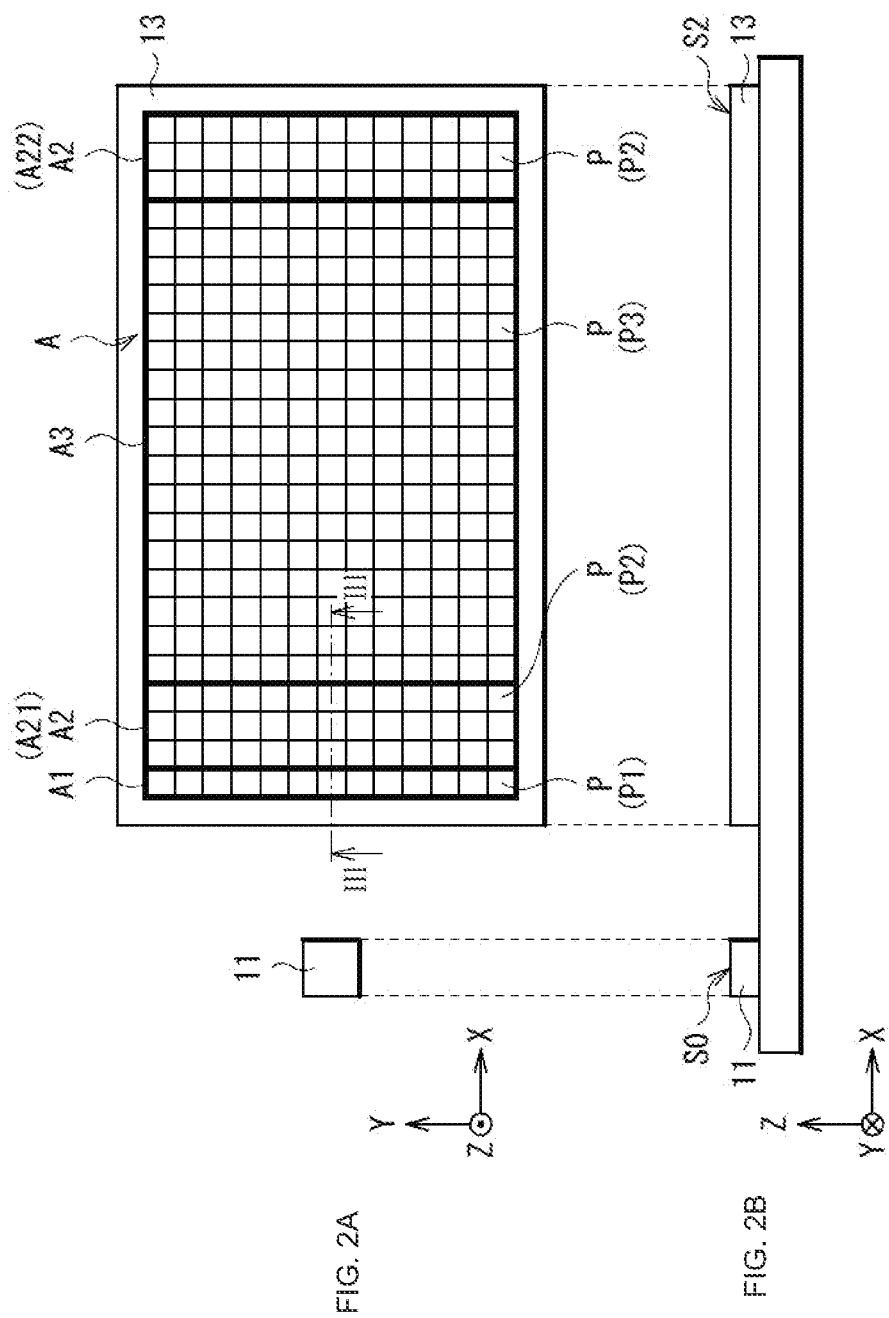

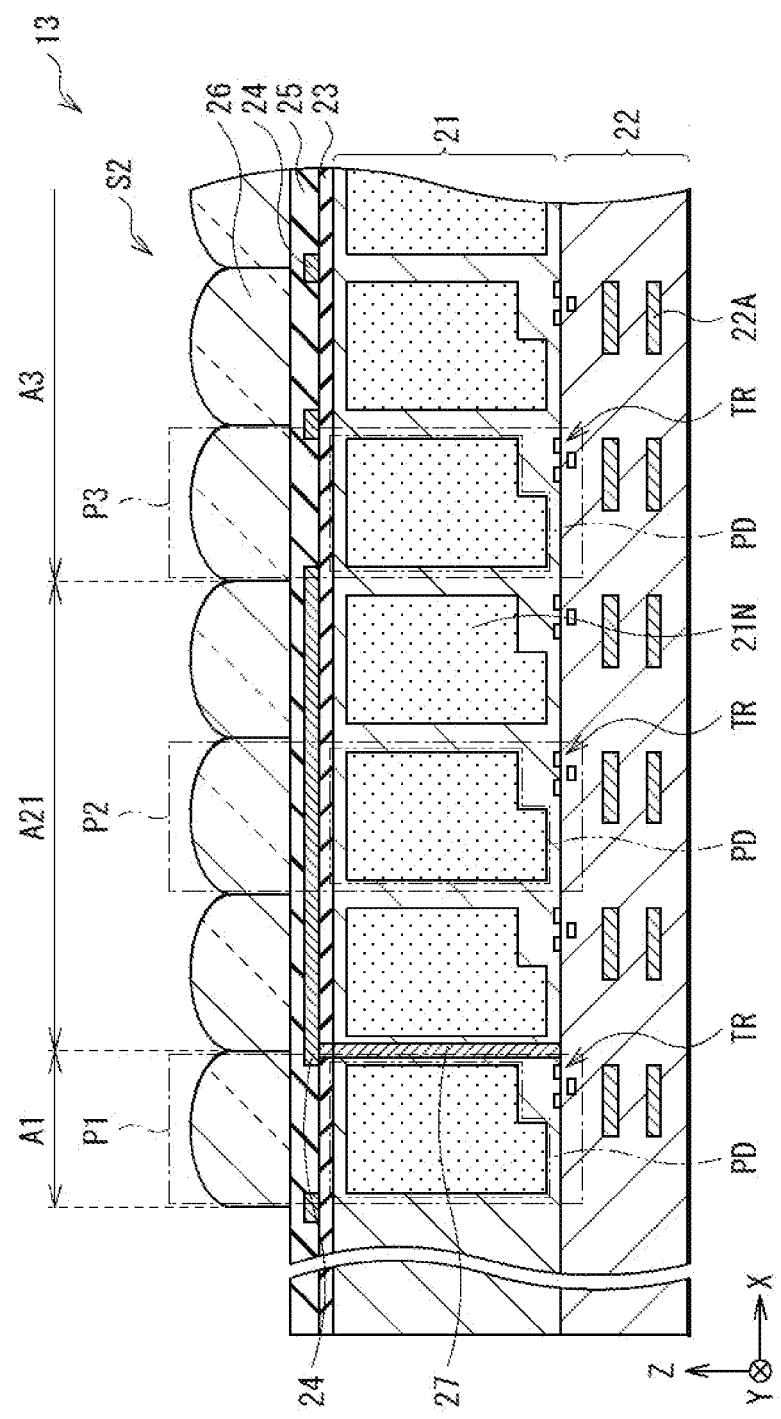
[FIG. 3]

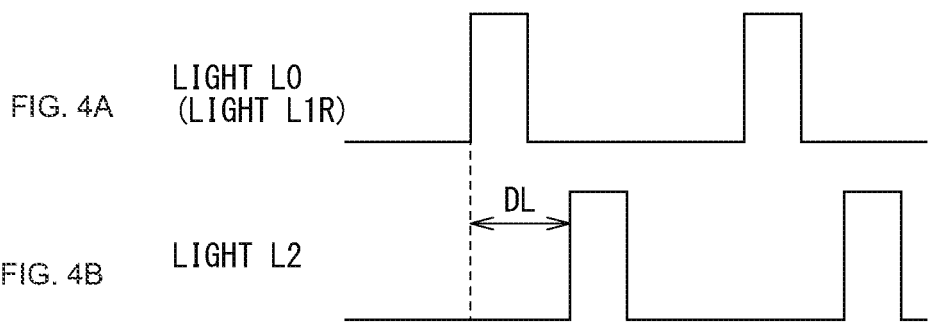

[FIG. 5]
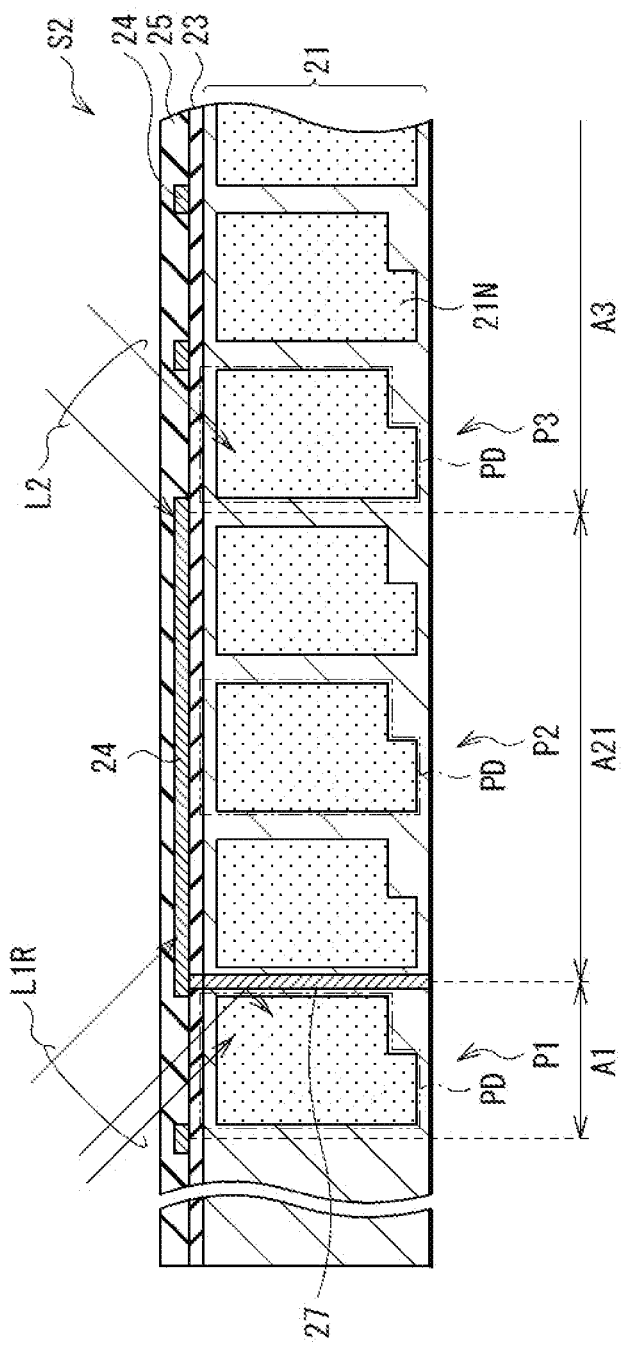

[FIG. 6]
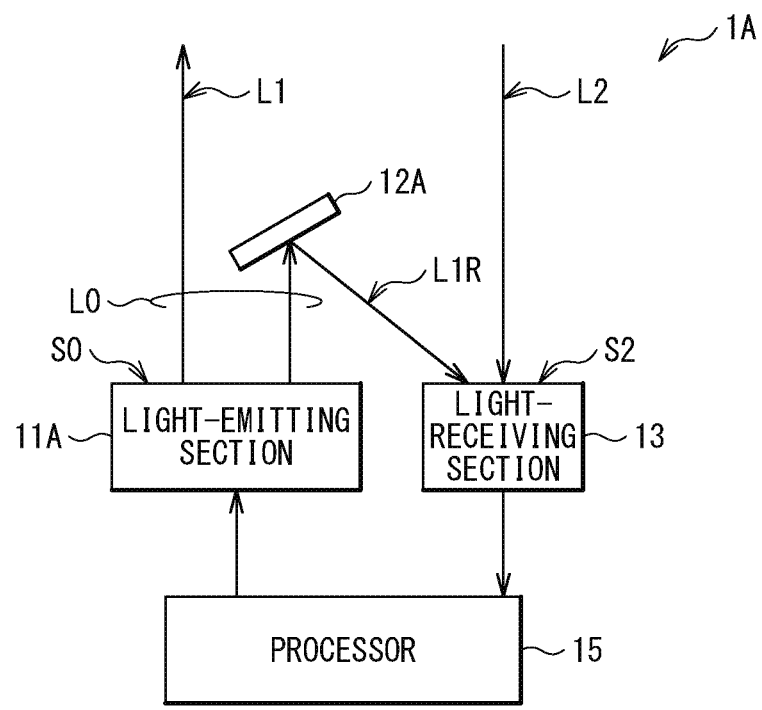

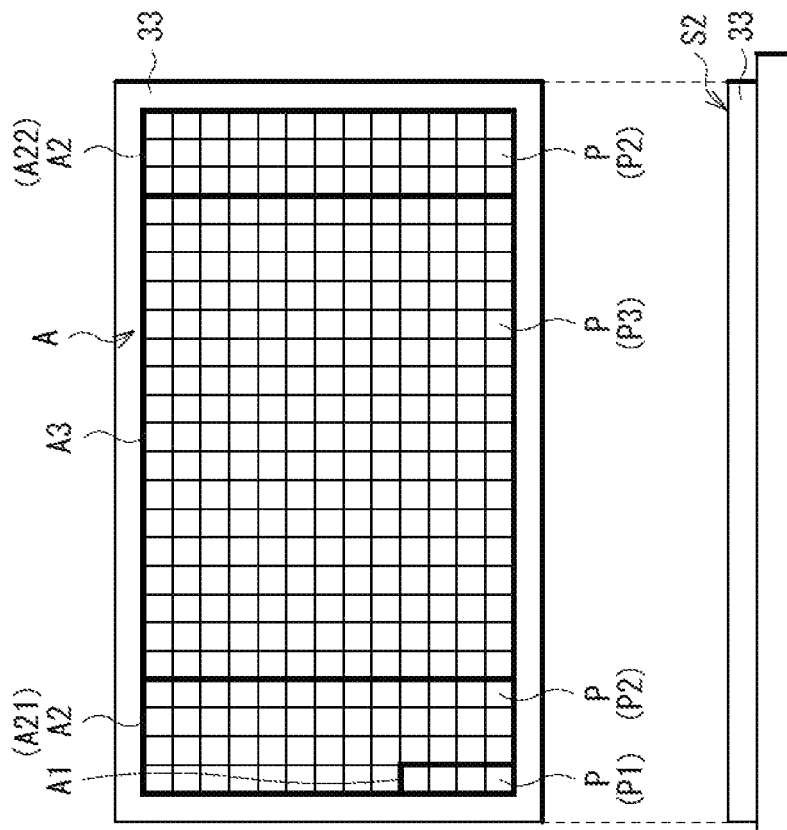
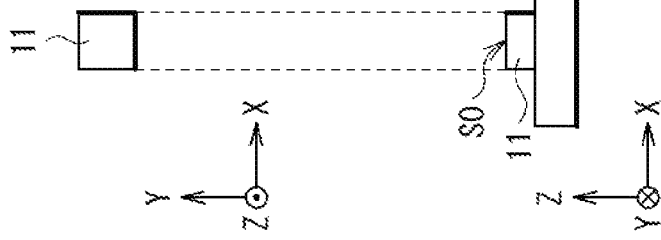
FIG. 7A
FIG. 7B

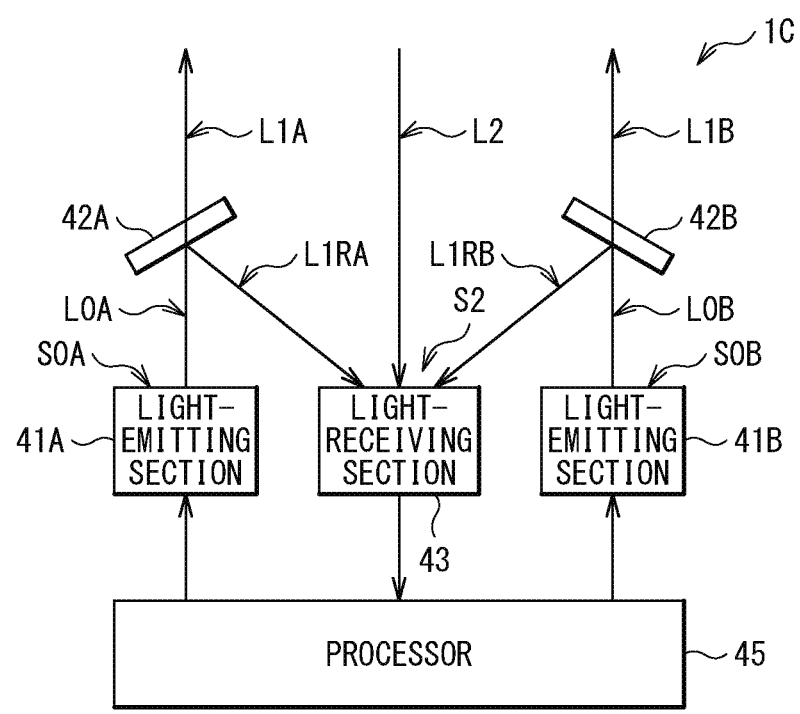
[FIG. 8]

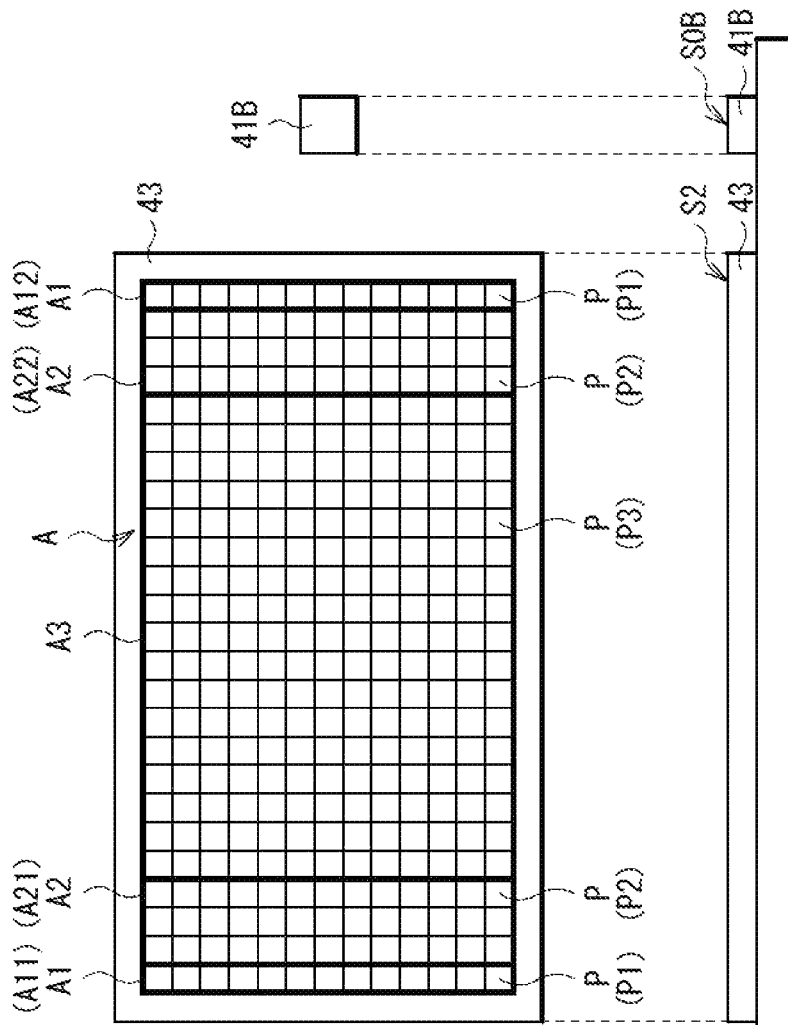
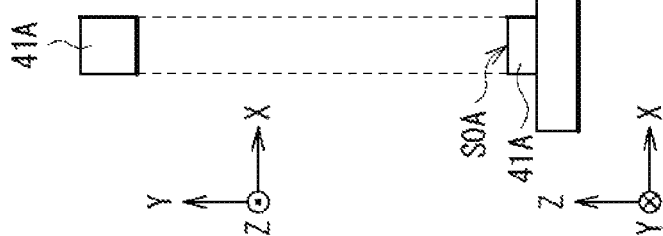
FIG. 9A
FIG. 9B

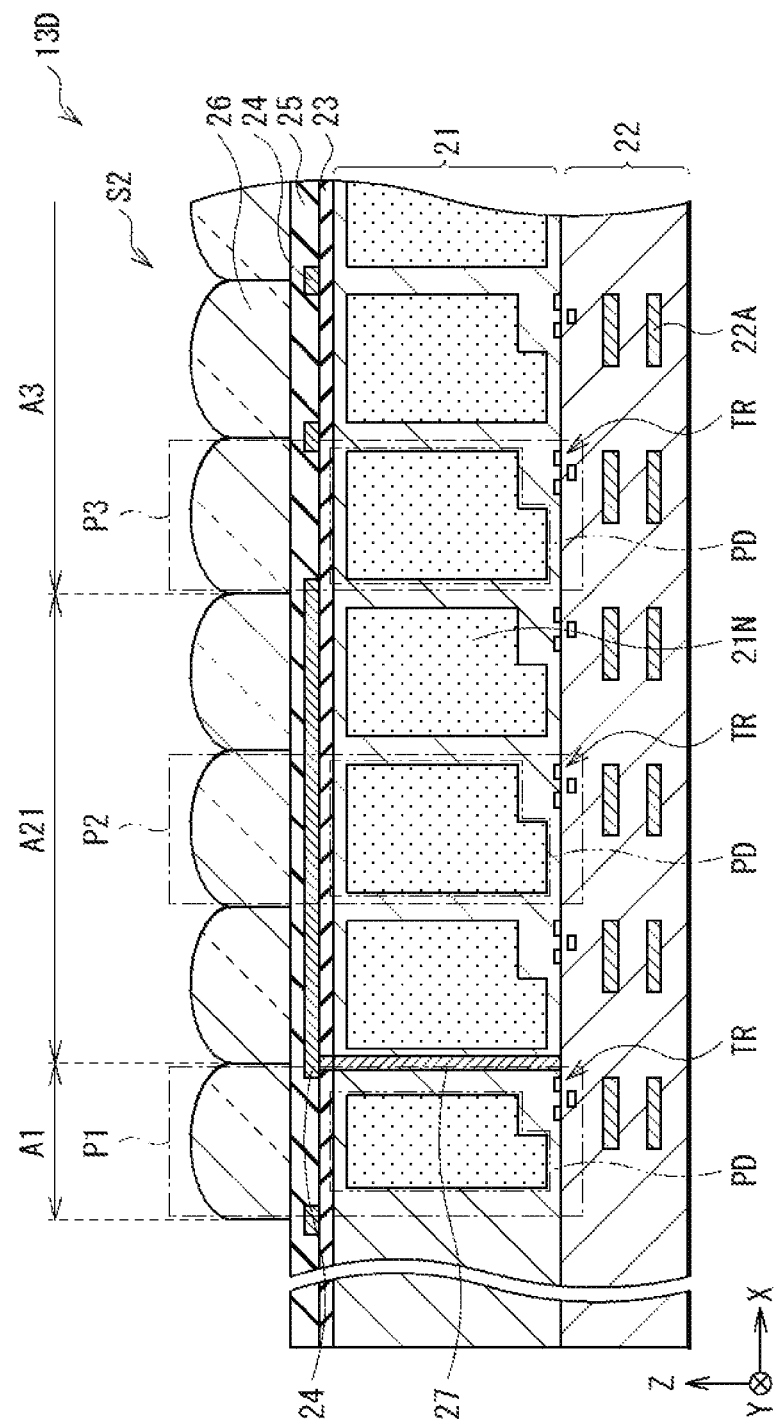
[FIG. 10]

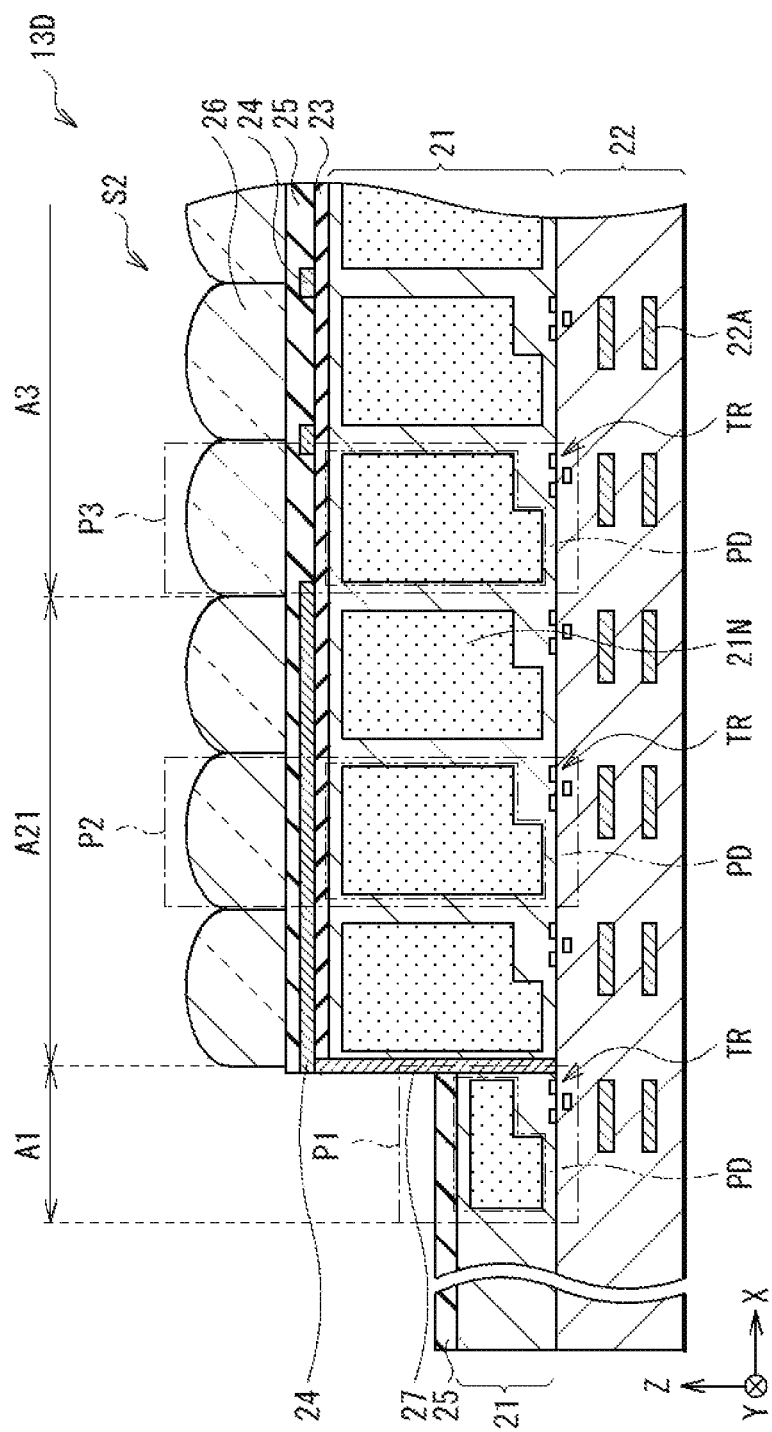
[FIG. 11]

[FIG. 12]
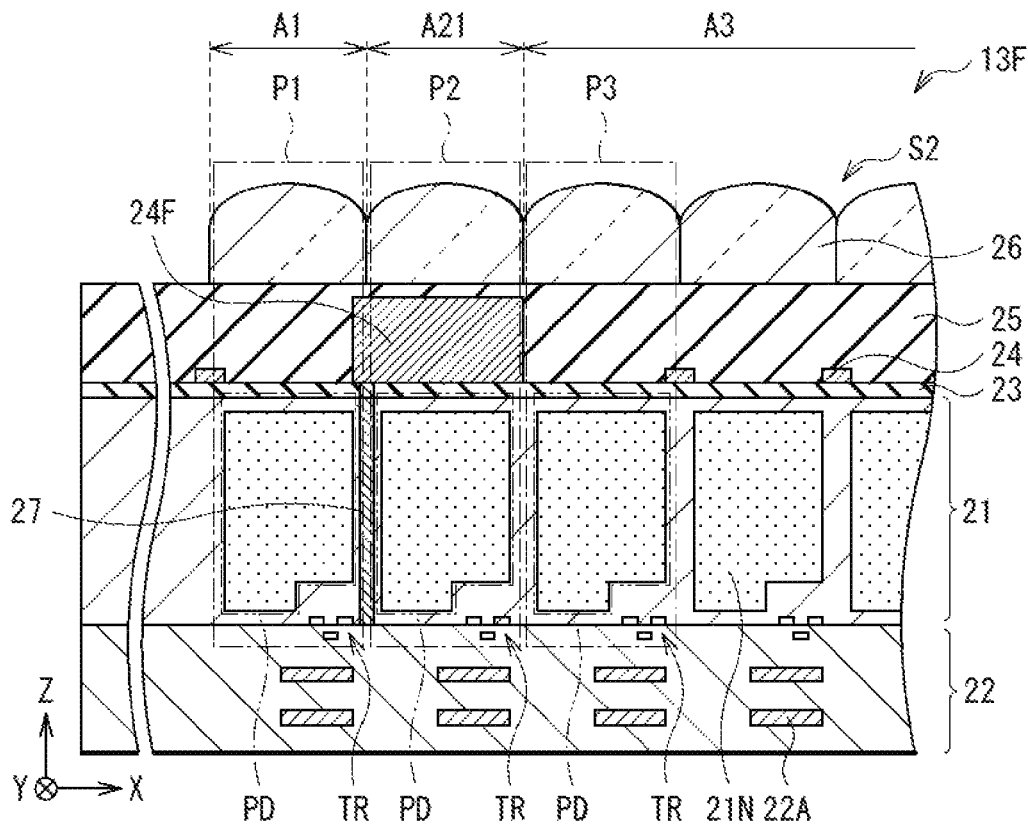
[FIG. 13]
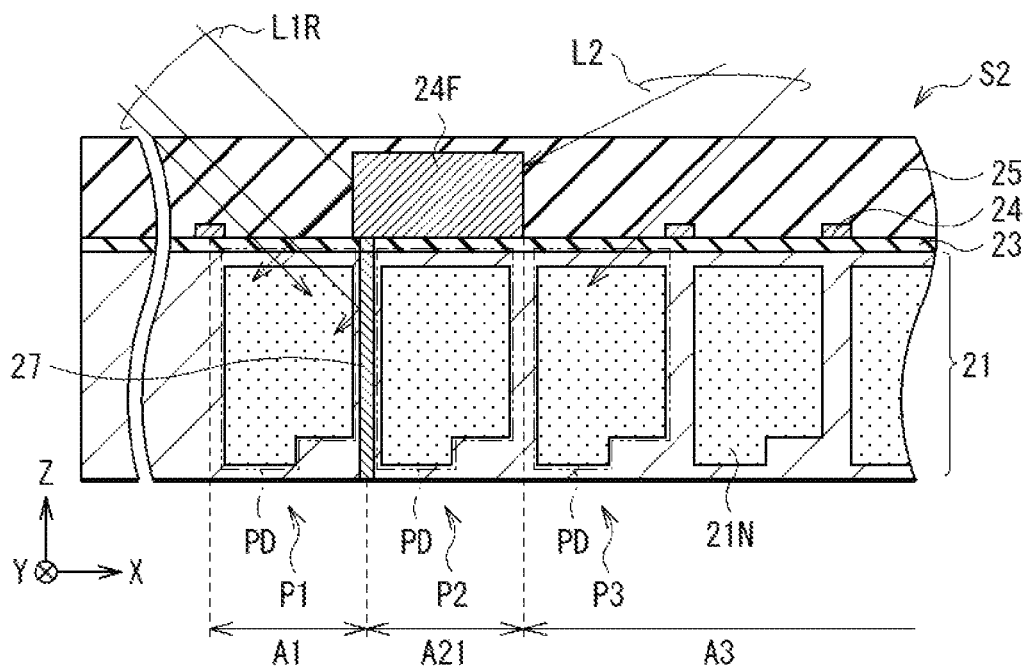

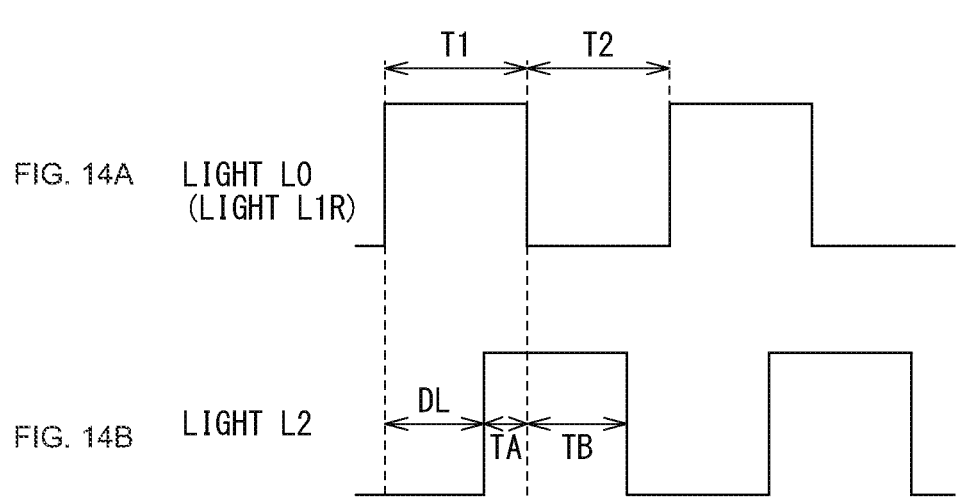

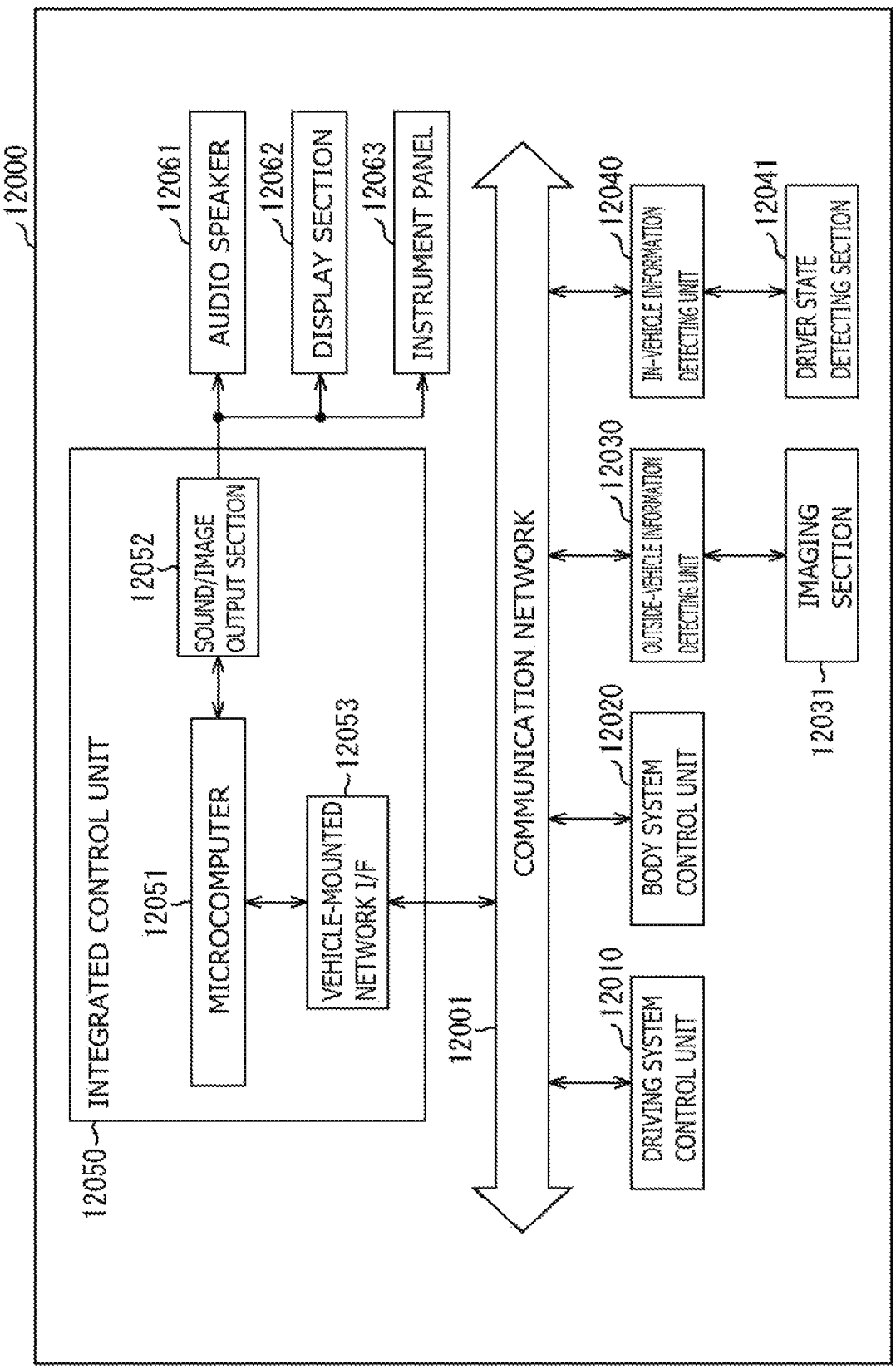
[FIG. 15]

[FIG. 16]
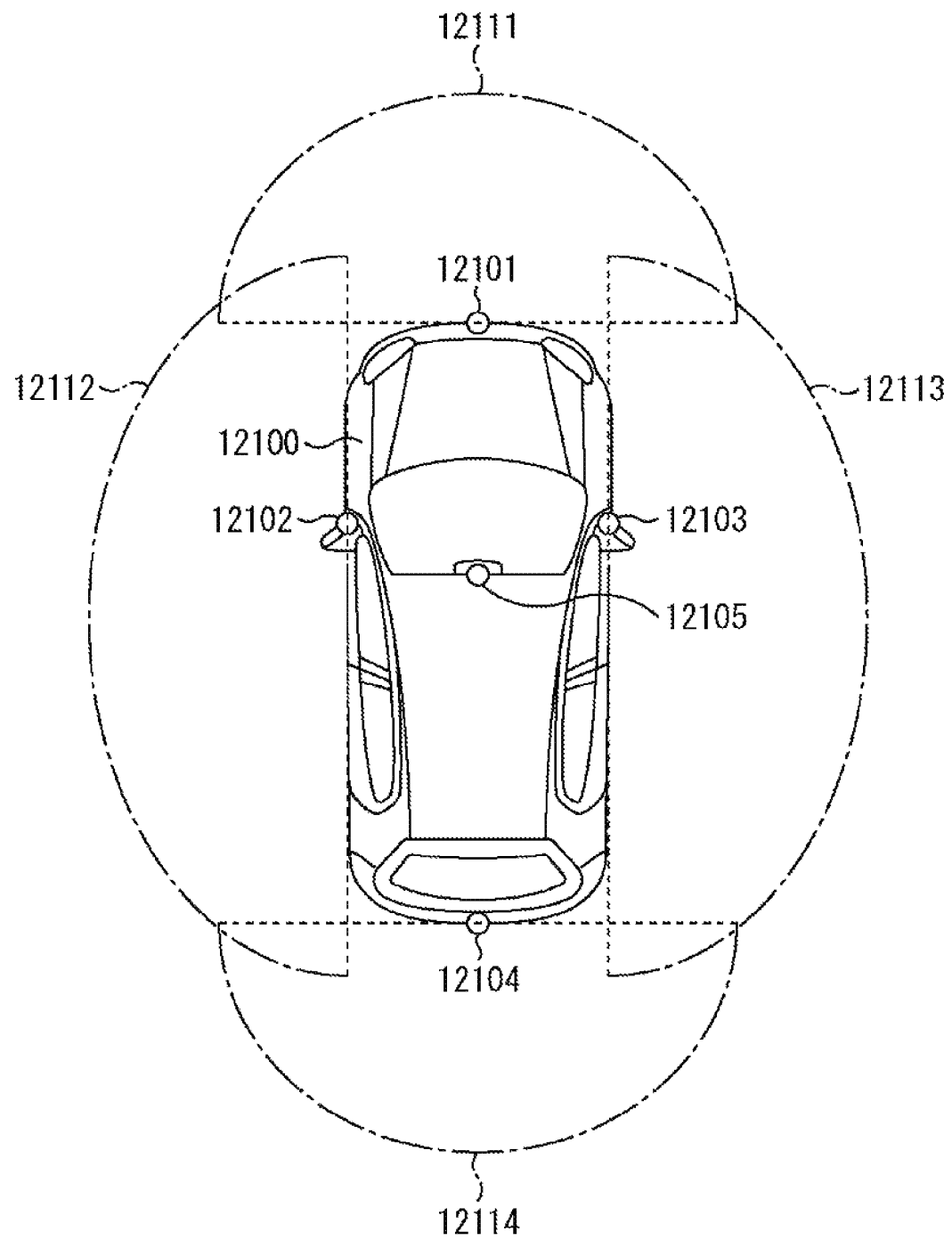

DISTANCE MEASURING DEVICE

CROSS REFERENCE TO RELATED APPLICATIONS

This application is a U.S. National Phase of International Patent Application No. PCT/JP2020/005311 filed on Feb. 12, 2020, which claims priority benefit of Japanese Patent Application No. JP 2019-050071 filed in the Japan Patent Office on Mar. 18, 2019. Each of the above-referenced applications is hereby incorporated herein by reference in its entirety.

TECHNICAL FIELD

The present disclosure relates to a distance measuring device that measures a distance to a measurement object.

BACKGROUND ART

A TOF (Time OF Flight) method is frequently used to measure a distance to a measurement object. In this TOF method, light is emitted, and reflected light reflected by the measurement object is detected. Then, in the TOF method, the distance to the measurement object is measured by measuring a time difference between a timing at which the light is emitted and a timing at which the reflected light is detected. For example, PTLs 1 and 2 disclose a technology for providing a light-receiving element that detects reflected light reflected inside a module in addition to a light-receiving element that detects reflected light reflected by a measurement object (see PTLs 1 and 2, for example).

CITATION LIST

Patent Literature

PTL 1: International Publication No. WO 2015/136099
PTL 2: International Publication No. WO 2015/136100

SUMMARY OF THE INVENTION

In a distance measuring device, high accuracy of a measured distance is desired, and further improvement in measurement accuracy is expected.

It is desirable to provide a distance measuring device that makes it possible to enhance measurement accuracy in distance measurement.

A distance measuring device according to an embodiment of the present disclosure includes a light-receiving section and a processor. The light-receiving section includes a first light-receiving pixel and a second light-receiving pixel that are configured to detect light, and a light-shielded pixel that is light-shielded, and the first light-receiving pixel, the light-shielded pixel, and the second light-receiving pixel are disposed in this order in a first direction. The processor is configured to measure a distance to a measurement object on the basis of a detection result in the first light-receiving pixel and a detection result in the second light-receiving pixel.

In the distance measuring device according to the embodiment of the present disclosure, the first light-receiving pixel, the light-shielded pixel, and the second light-receiving pixel are disposed in this order in the first direction. Then, the distance to the measurement object is measured on the basis of the detection result in the first light-receiving pixel and the detection result in the second light-receiving pixel.

BRIEF DESCRIPTION OF THE DRAWINGS

FIG. 1 is a block diagram illustrating a configuration example of a distance measuring device according to an embodiment of the present disclosure.

FIGS. 2A and 2B are explanatory diagrams illustrating a configuration example of a light-emitting section and a light-receiving section illustrated in FIG. 1.

FIG. 3 is a cross-sectional view of a configuration example of the light-receiving section illustrated in FIGS. 2A and 2B.

FIGS. 4A and 4B are timing waveform diagrams illustrating an operation example of the distance measuring device illustrated in FIG. 1.

FIG. 5 is an explanatory diagram illustrating an operation example of the light-receiving section illustrated in FIG. 3.

FIG. 6 is a block diagram illustrating a configuration example of a distance measuring device according to a modification example.

FIGS. 7A and 7B are explanatory diagrams illustrating a configuration example of a light-receiving section according to another modification example.

FIG. 8 is a block diagram illustrating a configuration example of a distance measuring device according to another modification example.

FIGS. 9A and 9B are explanatory diagram illustrating a configuration example of a light-emitting section and a light-receiving section illustrated in FIG. 8.

FIG. 10 is a cross-sectional view of a configuration example of a light-receiving section according to another modification example.

FIG. 11 is a cross-sectional view of a configuration example of a light-receiving section according to another modification example.

FIG. 12 is a cross-sectional view of a configuration example of a light-receiving section according to another modification example.

FIG. 13 is an explanatory diagram illustrating an operation example of the light-receiving section illustrated in FIG. 12.

FIGS. 14A and 14B are timing waveform diagrams illustrating an operation example of a distance measuring device according to another modification example.

FIG. 15 is a block diagram depicting an example of schematic configuration of a vehicle control system.

FIG. 16 is a diagram of assistance in explaining an example of installation positions of an outside-vehicle information detecting section and an imaging section.

MODES FOR CARRYING OUT THE INVENTION

In the following, some embodiments of the present disclosure are described in detail with reference to the drawings. It is to be noted that description is given in the following order.

1. Embodiment
2. Application Example to Mobile Body

1. Embodiment

[Configuration Example]

FIG. 1 illustrates a configuration example of a distance measuring device (a distance measuring device 1) according to an embodiment. The distance measuring device 1 is configured to measure a distance to a measurement object 100 by emitting light toward the measurement object 100, detecting light L2 reflected by the measurement object 100, and measuring a flight time of light on the basis of a thus-obtained detection result. The distance measuring device 1 is configured to measure the distance to the measurement object 100 by a direct method. The distance measuring device 1 includes a light-emitting section 11, a reflecting body 12, a light-receiving section 13, and a processor 15.

The light-emitting section 11 is configured to emit light L0 that is pulsed light from a light-emitting surface S0 on the basis of an instruction from the processor 15. The light-emitting section 11 includes, for example, a light source that emits infrared light. The light source is configured with use of a laser light source, an LED (Light Emitting Diode), or the like.

The reflecting body 12 is configured to allow a portion of the light L0 emitted from the light-emitting section 11 to pass therethrough, as well as to reflect a portion of the light L0. The reflecting body 12 is configured with use of a half mirror, for example. Light (light L1) having passed through the reflecting body 12 travels toward the measurement object 100, and is reflected by the measurement object 100. In addition, light (light L1R) reflected by the reflecting body 12 travels toward the light-receiving section 13.

The light-receiving section 13 is configured to detect the light L1R reflected by the reflecting body 12 and light L2 reflected by the measurement object 100.

FIGS. 2A and 2B illustrate a configuration example of the light-emitting section 11 and the light-receiving section 13. In this example, the light-emitting section 11 and the light-receiving section 13 are disposed in an XY plane, and is provided side by side in an X direction. The light-emitting surface SO of the light-emitting section 11 and a light-receiving surface S2 of the light-receiving section 13 are disposed to be directed in a Z direction.

The light-receiving section 13 includes a pixel array A. The pixel array A includes a plurality of pixels P arranged in a matrix. Each of the plurality of pixels P includes a light-receiving element PD. It is possible to use, for example, a photodiode such as an avalanche photodiode (APD; Avalanche Photodiode) or a single photon avalanche diode (SPAD; Single Photon Avalanche Diode) for the light-receiving element PD.

The pixel array A is divided into a plurality of regions A1, A2 (A21 and A22), and A3. The plurality of regions A1, A21, A3, and A22 are disposed in this order in the X direction.

The pixel P (a light-receiving pixel P1) that is able to detect light is disposed in the region A1. The light-receiving pixel P1 detects the light L1R reflected by the reflecting body 12. In this example, one column of the light-receiving pixels P1 provided side by side in a Y direction is disposed in the region A1. It is to be noted that this is not limitative, and a plurality of columns of the light-receiving pixels P1 may be disposed.

The pixel P (a light-shielded pixel P2) that is light-shielded to prevent light from being incident thereon is disposed in the region A2 (A21 and A22). Providing such a light-shielded pixel P2 makes it possible for the distance measuring device 1 to measure, for example, a so-called dark current passing through the light-receiving element PD. In this example, three columns of the light-shielded pixels P2 are disposed in each of the regions A21 and A22. It is to be noted that this is not limitative, and two or less columns of the light-shielded pixels P2 may be disposed, or four or more columns of the light-shielded pixels P2 may be disposed.

The pixel P (a light-receiving pixel P3) that is able to detect light is disposed in the region A3. The light-receiving pixel P3 detects the light L2 reflected by the measurement object 100.

FIG. 3 illustrates a schematic cross-sectional configuration of the light-receiving section 13 illustrated in FIGS. 2A and 2B as viewed from the direction of a ■-■ arrow. The light-receiving section 13 includes a semiconductor substrate 21, a multilayer wiring layer 22, an insulating film 23, a light-shielding film 24, an insulating film 25, and a lens 26.

The semiconductor substrate 21 is a substrate in which an element and a circuit in the light-receiving section 13 are formed, and is a P-type semiconductor substrate in this example. The semiconductor substrate 21 is provided with a plurality of N-type semiconductor regions 21N. The N-type semiconductor regions 21N are formed widely in the Z direction in the semiconductor substrate 21. The N-type semiconductor region 21N and a portion of the semiconductor substrate 21 on side of the light-receiving surface S2 as viewed from the N-type semiconductor regions 21N are included in the light-receiving element PD. In addition, a plurality of MOS transistors TR is provided on a surface, on side opposite to the light receiving surface S2, of the semiconductor substrate 21.

The multilayer wiring layer 22 is provided on a surface, on side opposite to the light-receiving surface S2, of the semiconductor substrate 21. The multilayer wiring layer 22 includes a plurality of wiring lines 22A, and an interlayer insulating film that insulates the plurality of wiring lines 22A from each other.

The insulating film 23 is a film serving as an antireflective film, and is provided on side of the light-receiving surface S2 of the semiconductor substrate 21. It is possible to configure the insulating film 23 with use of, for example, a material such as silicon nitride ($Si_3N_4$), hafnium oxide ($HfO_2$), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), or yttrium oxide ($Y_2O_3$). In addition, the insulating film 23 may be configured by stacking two or more layers using these materials.

The light-shielding film 24 is a film that shields light to prevent light from entering the semiconductor substrate 21, and is provided on the insulating film 23. Specifically, the light-shielding film 24 is provided in the region A2 (A21 and A22), between a plurality of pixels P (the light-receiving pixels P1) in the region A1, and between a plurality of pixels P (the light-receiving pixels P3) in the region A3. It is possible to configure the light-shielding film 24 with use of various materials that are able to shield light. Specifically, it is possible to configure the light-shielding film 24 with use of, for example, metal such as tungsten (W), aluminum (Al), or copper (Cu), a resin including a coloring agent such as a pigment or a dye used for a block color filter.

The insulating film 25 is a film serving as a planarization film, and is provided on the light-shielding film 24 and the insulating film 23.

The lens 26 is provided on the insulating film 25. The lens 26 is formed with use of, for example, an organic material such as a resin.

The pixels P (the light-receiving pixels P1 and P3, and the light-shielded pixels P2) each include the light-receiving element PD, the MOS transistor TR, and the lens 26. In this example, the light-receiving element PD of the light-receiving pixel P1, the light-receiving element PD of the light-shielded pixel P2, and the light-receiving element PD of the light-receiving pixel P3 have configurations similar to each other. In this diagram, the pixel P including one MOS transistor TR is illustrated, but this is not limitative. The pixel P may include a plurality of MOS transistors TR. In addition, as described above, the light-shielding film 24 is provided in the region A21. This prevents light from entering the light-shielded pixel P2.

In the semiconductor substrate 21, a trench may be provided between adjacent light-receiving pixels P3 in the region A3. This makes it possible to suppress color mixture. Likewise, in the semiconductor substrate 21, a trench may be provided between adjacent light-shielded pixels P2 in the region A2. This makes it possible to determine the reference of a black level more accurately. The insulating film 23 may be provided inside these trenches.

In the semiconductor substrate 21, a light-shielding wall 27 is provided between the region A1 and the region A21. The light-shielding wall 27 is configured to be provided in a standing manner in the Z direction. The light-shielding wall 27 may be configured to reflect light, or may be configured to absorb light. In this example, the light-shielding wall 27 is formed to penetrate both surfaces of the semiconductor substrate 21. In a case where a trench is provided between adjacent light-receiving pixels P3 or between adjacent light-shielded pixels P2, it is desirable that the light-shielding wall 27 have a depth equal to or larger than a depth of the trench. This makes it possible to reduce a possibility that the light L1R reflected by the reflecting body 12 enters the region A21, and to easily obtain a black level with use of the light-shielded pixels P2. This consequently makes it possible to reduce the pixel number of the light-shielded pixels P2, thus making it possible to downsize the light-receiving section 13. In this example, in FIGS. 2A and 2B, the light-shielding wall 27 is formed over a plurality of pixels P provided side by side in the Y direction along a boundary between the region A1 and the region A2. In a case where the light-shielding wall 27 is configured to reflect light, it is possible to configure the light-shielding wall 27 with use of, for example, metal such as tungsten (W), aluminum (Al), or copper (Cu). It is possible to form the light-shielding wall 27, for example, by forming a trench in the semiconductor substrate 21 and thereafter evaporating metal. It is to be noted that this is not limitative. For example, various configurations may be used that makes it possible to totally reflect light at an interface between the semiconductor substrate 21 and the trench. For example, in a case where a refractive index on both sides of the interface satisfies a total reflection condition without metal, no metal may be evaporated. In addition, in a case where the light-shielding wall 27 is configured to absorb light, it is possible to form the light-shielding wall 27, for example, by coating with a resin including a coloring agent such as a pigment or a dye used for a black color filter.

The processor 15 (FIG. 1) is configured to perform control to cause the light-emitting section 11 to emit the light L0, as well as to measure a distance to the measurement object 100 in units of the light-receiving pixels P3 by measuring a flight time of light on the basis of detection results in the light-receiving pixels P1 in the region A1 and the light-receiving pixels P3 in the region A3 in the light-receiving section 13. Specifically, for example, the processor 15 measures a time from a timing at which the light-receiving pixel P1 receives the light L1R to a timing at which the light-receiving pixel P3 receives the light L2 to measure the distance to the measurement object 100 in units of the light-receiving pixels P3.

It is to be noted that this is not limitative, and it is possible to use various methods based on the detection results in the light-receiving pixels P1 and the detection results in the light-receiving pixels P3. Specifically, for example, the processor 15 may measure a time from an instruction timing at which the light-emitting section 11 is instructed to emit the light L0 to a timing at which the light-receiving pixel P1 receives the light L1R and measure a time from the instruction timing to a timing at which the light-receiving pixel P3 receives the light L2 to measure the distance to the measurement object 100 in units of the light-receiving pixels P3 on the basis of a difference between these times.

In the distance measuring device 1, a light diffusion member, n optical filter such as a bandpass filter, a lens, or any other optical member may be appropriately provided in an optical path until light emitted from the light-emitting section 11 is reflected by the measurement object 100 and the reflected light is detected by the light-receiving section 13. Likewise, a light diffusion member, an optical filter such as a bandpass filter, a lens, or any other optical member may be appropriately provided in an optical path until light emitted from the light-emitting section 11 is reflected by the reflecting body 12 and the reflected light is detected by the light-receiving section 13.

Here, the light-receiving pixel P1 corresponds to a specific example of a "first light-receiving pixel" in the present disclosure. The light-receiving pixel P3 corresponds to a specific example of a "second light-receiving pixel" in the present disclosure. The light-shielded pixel P2 corresponds to a specific example of a "light-shielded pixel" in the present disclosure. The light-shielding wall 27 corresponds to a specific example of a "light-shielding wall" in the present disclosure. The light-shielding film 24 corresponds to a specific example of a "light-shielding film" and an "inter-pixel light-shielding film" in the present disclosure. The reflecting body 12 corresponds to a specific example of a "light guide member" in the present disclosure.

[Operation and Workings]

Next, an operation and workings of the distance measuring device according to the present embodiment are described.

(Overview of Overall Operation)

First, an overview of an overall operation of the distance measuring device 1 is described with reference to FIG. 1. The light-emitting section 11 emits the light L0 on the basis of an instruction from the processor 15. The reflecting body 12 allows a portion of the light L0 emitted from the light-emitting section 11 to pass therethrough, and reflects a portion of the light L0. The light L1 having passed through the reflecting body 12 travels toward the measurement object 100, and is reflected by the measurement object 100. In addition, the light L1R reflected by the reflecting body 12 travels toward each of the light-receiving pixels P1 in the region A1 of the light-receiving section 13. The light L2 reflected by the measurement object 100 travels toward each of the light-receiving pixels P3 in the region A3 of the light-receiving section 13. Each of the light-receiving pixels P1 in the region A1 of the light-receiving section 13 detects the light L1R, and each of the light-receiving pixels P3 in the region A3 of the light-receiving section 13 detects the light L2. The processor 15 measures a flight time of light on the basis of the detection results in the light-receiving pixels P1 and the light-receiving pixels P3 in the light-receiving section 13 to measure a distance to the measurement object 100 in units of the light-receiving pixels P3.

(Detailed Operation)

FIGS. 4A and 4B illustrate an example of a distance measurement operation in the distance measuring device 1. The distance measuring device 1 measures a distance to the measurement object 100 by a so-called direct method. FIG. 4A, indicates a waveform of the light L0 emitted from the light-emitting section 11, and FIG. 4B indicates a waveform of the light L2 detected by the light-receiving section 13.

The light-emitting section 11 emits the light L0 having a pulse waveform on the basis of an instruction from the processor 15 of FIG. 4A). The light L0 enters the reflecting body 12, and the light L1 having passed through the reflecting body 12 travels toward the measurement object 100. Then, the light L1 is reflected by the measurement object 100, and the reflected light L2 travels toward the light-receiving section 13. Then, the light-receiving pixel P3 in the region A3 of the light-receiving section 13 detects the light L2 of FIG. 4B). The light L2 detected by the light-receiving pixel P3 has a waveform delayed by a delay time DL with respect to the waveform of the light L0 illustrated in of FIG. 4A. The delay time DL is a time in which light travels in order of the light-emitting section 11, the reflecting body 12, the measurement object 100, and the light-receiving section 13, and corresponds to a flight time of light. The flight time of light corresponds to a distance between the distance measuring device 1 and the measurement object 100.

Meanwhile, the light L1R reflected by the reflecting body 12 travels toward the light-receiving section 13. The light-receiving pixel P1 in the region A1 of the light-receiving section 13 detects the light L1R of FIG. 4B). The waveform of the light L1R detected by the light-receiving pixel P1 is substantially similar to the waveform of the light L0 illustrated in of FIG. 4A, for example. The processor 15 measures a time from a timing at which the light-receiving pixel P1 receives the light L1R to a timing at which the light-receiving pixel P3 receives the light L2. This makes it possible for the distance measuring device 1 to remove an influence of circuit delay in the light-emitting section 11, the light-receiving section 13, and the processor 15 and to measure the flight time of light more accurately. This makes it possible for the distance measuring device 1 to measure the distance to the measurement object 100.

FIG. 5 illustrates an example of a light detection operation in the light-receiving section 13. It is to be noted that FIG. 5 simply illustrates the light-receiving section 13 for convenience of description. In this example, the light L1R reflected by the reflecting body 12 and the light L2 reflected by the measurement object 100 enter the light-receiving section 13. It is to be noted that FIG. 5 illustrates the light L1R and the light L2, but the light L1R and the light L2 generally enter the light-receiving section 13 at timings different from each other.

The light L1R reflected by the reflecting body 12 enters the light-receiving section 13. The light-receiving element PD of the light-receiving pixel P1 in the region A1 of the light-receiving section 13 detects the light L1R. Of the light L1R, light having entered the light-receiving element PD of the light-receiving pixel P1 is reflected or absorbed by the light-shielding wall 27, thereby hindering leakage of the light L1R from the light-receiving pixel P1. This makes it possible for the light-receiving element PD of the light-receiving pixel P1 to effectively detect the light L1R. Specifically, in a case where the light-shielding wall 27 is configured to reflect light, it is possible to gain an optical path length, which makes it possible to detect the light L1R more effectively. In addition, the light-receiving element PD of the light-shielded pixel P2 in the region A21 is light-shielded by the light-shielding wall 27 and the light-shielding film 24, which prevents the light L1R from entering the light-receiving element PD of the light-shielded pixel P2. In addition, the light-receiving pixel P1 that detects the light L1R and the light-receiving pixel P3 that detects the light L2 are separated from each other, which makes it possible to reduce a possibility that the light L1R enters the light-receiving element PD of the light-receiving pixel P3. This makes it possible for the distance measuring device 1 to reduce a possibility that the light-receiving pixel P3 in the region A3 detects the light L1R, thus making it possible to enhance measurement accuracy.

Meanwhile, the light L2 reflected by the measurement object 100 enters the light-receiving section 13. The light-receiving element PD of the light-receiving pixel P3 in the region A3 of the light-receiving section 13 detects the light L2. The light-receiving element PD of the light-shielded pixel P2 in the region A21 is light-shielded by the light-shielding film 24, which makes it possible to reduce a possibility that the light L2 enters the light-receiving element PD of the light-shielded pixel P2. In addition, the light-receiving pixel P1 that detects the light L1R and the light-receiving pixel P3 that detects the light L2 are separated from each other, which makes it possible to reduce a possibility that the light L2 enters the light-receiving element PD of the light-receiving pixel P1. This makes it possible for the distance measuring device 1 to reduce a possibility that the light-receiving pixel P1 in the region A1 detects the light L2, thus making it possible to enhance measurement accuracy.

As described above, in the distance measuring device 1, the light-shielded pixel P2 is provided between the light-receiving pixel P1 that detects the light L1R and the light-receiving pixel P3 that detects the light L2 to separate the position of the light-receiving pixel P1 in the region A1 and the position of the light-receiving pixel P3 in the region A3 from each other. This makes it possible for the distance measuring device 1 to reduce a possibility that the light-receiving pixel P3 in the region A3 detects the light L1R and to reduce a possibility that the light-receiving pixel P1 in the region A1 detects the light L2. As a result, in the distance measuring device 1, it is possible to more accurately detect a timing at which the light-receiving pixel P1 receives the light L1R and a timing at which the light-receiving pixel P3 receives the light L2, thus making it possible to enhance measurement accuracy.

In addition, in the distance measuring device 1, the light-shielded pixel P2 is provided between the light-receiving pixel P1 that detects the light L1R and the light-receiving pixel P3 that detects the light L2, which makes it possible to provide the light-shielded pixel P2 while effectively using a limited area. This makes it possible for the distance measuring device 1 to measure, for example, a so-called dark current passing through the light-receiving element PD of the light-shielded pixel P2 and measure the distance to the measurement object 100 on the basis of a result of such measurement, which makes it possible to enhance measurement accuracy.

In addition, in the distance measuring device 1, the light-shielding wall 27 is provided between the light-receiving pixel P1 in the region A1 and the light-shielded pixel P2 in the region A21. Accordingly, light, which has entered the light-receiving element PD of the light-receiving pixel P1, of the light L1R is reflected by the light-shielding wall 27, thereby hindering leakage of the light L1R from the light-receiving pixel P1, which makes it possible for the light-receiving element PD of the light-receiving pixel P1 to effectively detect the light L1R. This makes it possible for the distance measuring device 1 to more accurately detect a timing at which the light-receiving pixel P1 receives the light L1R, thus making it possible to enhance measurement accuracy.

[Effects]

As described above, in the present embodiment, the light-shielded pixel P2 is provided between the light-receiving pixel P1 that detects the light L1R and the light-receiving pixel P3 that detects the light L2, which makes it possible to enhance measurement accuracy.

In the present embodiment, the light-shielding wall 27 is provided between the light-receiving pixel P1 in the region A1 and the light-shielded pixel P2 in the region A21, which makes it possible to enhance measurement accuracy.

Modification Example 1

In the above-described embodiment, as illustrated in FIG. 1, a reflecting body 12A is configured with use of a half mirror, but this is not limitative, and a mirror, an optical fiber, a lens, or the like may be used. Alternatively, in an optical module including a light-emitting section and a light-receiving section, a reflecting body may be configured with use of glass, plastic, or the like provided between the light-emitting section and the light-receiving section. FIGS. 7A and 7B illustrate a configuration example of a distance measuring device 1A in a case where a reflecting body is configured with use of a mirror. The distance measuring device 1A includes a light-emitting section 11A and the reflecting body 12A. The light-emitting section 11A is configured to emit the light L0 that is pulsed light from the light-emitting surface SO on the basis of an instruction from the processor 15. The light-emitting section 11A includes, for example, a plurality of light sources. The reflecting body 12A is configured to reflect the light L0 emitted from some light sources of the plurality of light sources of the light-emitting section 11A. The reflecting body 12A is configured with use of a reflector, for example. Here, the reflecting body 12A corresponds to a specific example of a "light guide member" in the present disclosure. The light L1R reflected by the reflecting body 12A travels toward the light-receiving section 13. Of the light L0 emitted from the light-emitting section 11A, light that does not enter the reflecting body 12A travels as the light L1 toward the measurement object 100.

Modification Example 2

In the embodiment described above, as illustrated in FIGS. 2A and 2B, one column of the pixels P (the light-receiving pixels P1) is provided in the region A1, but this is not limitative. Instead of this, for example, a plurality of columns of the pixels P may be provided in the region A1. In addition, for example, as with a light-receiving section 33 illustrated in FIGS. 7A and 7B, a smaller number of the pixels P than the number of the pixels P in one column may be provided. In this example, four light-receiving pixels P1 are provided. It is to be noted that in this example, four light-receiving pixels P1 are collectively disposed around an end in a direction opposite to the Y direction (bottom side in FIGS. 7A and 7B), but this is not limitative. For example, the light-receiving pixels P1 may be disposed around the middle in the Y direction, or may be collectively disposed around an end in the Y direction (top side in FIGS. 7A and 7B).

Modification Example 3

In the embodiment described above, one light-emitting section 11 is provided, but this is not limitative. Instead of this, a plurality of light-emitting sections 11 may be provided. An example in which two light-emitting sections are provided is described in detail below.

FIG. 8 illustrates a configuration example of a distance measuring device 1C according to the present modification example. The distance measuring device 1C includes light-emitting sections 41A and 41B, reflecting bodies 42A and 42B, a light-receiving section 43, and a processor 45.

The light-emitting section 41A is configured to emit light L0A that is pulsed light from a light-emitting surface S0A on the basis of an instruction from the processor 45. Similarly, the light-emitting section 41B is configured to emit light L0B that is pulsed light from a light-emitting surface S0B on the basis of an instruction from the processor 45.

The reflecting body 42A is configured to allow a portion of the light L0A emitted from the light-emitting section 41 to pass therethrough, as well as to reflect a portion of the light L0A. Light (light L1A) having passed through the reflecting body 42A travels toward the measurement object 100, and is reflected by the measurement object 100. In addition, light (light L1RA) reflected by the reflecting body 42A travels toward the light-receiving section 43. Similarly, the reflecting body 42B is configured to allow a portion of the light L0B emitted from the light-emitting section 41 to pass therethrough, as well as to reflect a portion of the light L0B. Light (light L1B) having passed through the reflecting body 42B travels toward the measurement object 100, and is reflected by the measurement object 100. In addition, light (light L1RB) reflected by the reflecting body 42B travels toward the light-receiving section 43.

The light-receiving section 43 is configured to detect the light L1RA reflected by the reflecting body 42A, the light L1RB reflected by the reflecting body 42B, and the light L2 reflected by the measurement object 100.

FIGS. 9A and 9B illustrate a configuration example of the light-emitting sections 41A and 41B and the light-receiving section 43. In this example, the light-emitting section 41A, the light-receiving section 43, and the light-emitting section 41B are disposed in an XY plane, and is provided side by side in the X direction in this order. The light-emitting surface S0A of the light-emitting section 41A, the light-emitting surface S0B of the light-emitting section 41B, and the light-receiving surface S2 of the light-receiving section 43 are disposed to be directed in the Z direction. The pixel array A is divided into a plurality of regions A1 (A11 and A12), A2 (A21 and A22), and A3. The plurality of regions A11, A21, A3, A22, and A12 is disposed in the X direction in this order. The light-receiving pixel P1 is disposed in the region A1 (A11 and A12). The light-receiving pixel P1 disposed in the region A11 detects the light L1RA reflected by the reflecting body 42A, and the light-receiving pixel P1 disposed in the region A12 detects the light L1RB reflected by the reflecting body 42B.

In this example, one column of the pixels P (the light-receiving pixels P1) is provided in each of the regions A11 and A12, but this is not limitative. Instead of this, for example, as with Modification Example 2, for example, a smaller number of the pixels P than the number of the pixels P in one column may be provided in the region A11. Alternatively, a smaller number of the pixels P than the number of the pixels P in one column may be provided in the region A12. Alternatively, a smaller number of the pixels P than the number of the pixels P in one column may be provided in each of the region A11 and A12.

The processor 45 (FIG. 1) performs control to cause the light-emitting section 41A to emit the light L0A, and performs control to cause the light-emitting section 41B to emit the light L0B. In addition, the processor 45 measures a flight time of light on the basis of a detection result in the light-receiving pixel P3 of the light-receiving section 43 to measure a distance to the measurement object 100 in units of the light-receiving pixels P3.

Modification Example 4

In the embodiment described above, the light-receiving element PD of the light-receiving pixel P1 has a configuration similar to those of the light-receiving element PD of the light-receiving pixel P3 and the light-receiving element PD of the light-shielded pixel P2, but this is not limitative. The present modification example is described below with reference to some examples.

For example, as with a light-receiving section 13D illustrated in FIG. 10, the light-receiving element PD of the light-receiving pixel P1 may have a width in the X direction that is different from a width in the X direction of the light-receiving element PD of the light-receiving pixel P3 and a width in the X direction of the light-receiving element PD of the light-shielded pixel P2. In this example, the width in the X direction of the light-receiving element PD of the light-receiving pixel P1 is narrower than the width in the X direction of the light-receiving element PD of the light-receiving pixel P3 and the width in the X direction of the light-receiving element PD of the light-shielded pixel P2, but this is not limitative. For example, the width in the X direction of the light-receiving element PD of the light-receiving pixel P1 may be wider than the width in the X direction of the light-receiving element PD of the light-receiving pixel P3 and the width in the X direction of the light-receiving element PD of the light-shielded pixel P2.

In addition, for example, an impurity (dopant) concentration distribution in the light-receiving element PD of the light-receiving pixel P1 may be different from an impurity concentration distribution in the light-receiving element PD of the light-receiving pixel P3 and an impurity concentration distribution in the light-receiving element PD of the light-shielded pixel P2. In the light-receiving element PD, for example, an impurity concentration gradient in the N-type semiconductor region 21N is set to make an N-type impurity concentration lower toward the light-receiving surface S2 and to make the N-type impurity concentration higher with increasing distance from the light-receiving surface S2. For example, an impurity concentration gradient in the light-receiving element PD of the light-receiving pixel P1 may be larger than an impurity concentration gradient in the light-receiving element PD of the light-receiving pixel P3 and an impurity concentration gradient in the light-receiving element PD of the light-shielded pixel P2. More specifically, in a depth direction (direction Z), an impurity concentration in the N-type semiconductor region 21N of the region A1 may become higher than impurity concentrations in the N-type semiconductor regions 21N of the regions A2 and A3 with increasing distance from the light-receiving surface S2.

In addition, as with a light-receiving section 13E illustrated in FIG. 11, the light-receiving element PD of the light-receiving pixel P1 may have a thickness in the Z direction that is different from a thickness in the Z direction of the light-receiving element PD of the light-receiving pixel P3 and a thickness in the Z direction of the light-receiving element PD of the light-shielded pixel P2. In this example, the thickness in the Z direction of the light-receiving element PD of the light-receiving pixel P1 is thinner than the thickness in the Z direction of the light-receiving element PD of the light-receiving pixel P3 and the thickness in the Z direction of the light-receiving element PD of the light-shielded pixel P2. Further, in this example, the width in the X direction of the light-receiving element PD of the light-receiving pixel P1 is wider than the width in the X direction of the light-receiving element PD of the light-receiving pixel P3 and the width in the X direction of the light-receiving element PD of the light-shielded pixel P2. That is, the light L1R is infrared light, and there is a possibility that an optical path length is shortened in a case where the thickness in the Z direction of the light-receiving element PD of the light-receiving pixel P3 is decreased; therefore, the optical path length is secured by increasing the width in the X direction. It is possible to from such a light-receiving pixel P1, for example, by forming the light-shielding wall 27 between the region A1 and the region A21 and forming the light-shielding film 24, and thereafter etching a front surface of the semiconductor substrate 21 in the region A1.

Modification Example 5

In the embodiment described above, the light-shielding film 24 provided in the region A21 has a thickness equal to a thickness of the light-shielding film 24 provided between the plurality of pixels P (the light-receiving pixels P1) in the region A1 and a thickness of the light-shielding film 24 provided between the plurality of pixels P (the light-receiving pixels P3) in the region A3, but this is not limitative. A distance measuring device 1F according to the present modification example is described in detail below.

FIG. 12 illustrates a configuration example of a light-receiving section 13F of the distance measuring device 1F. In this example, one column of the light-shielded pixels P2 provided side by side in the Y direction is disposed in the region A21. That is, in the embodiment described above (FIGS. 2A, 2B, and 3), three columns of the light-shielded pixels P2 are disposed in the region A21, but in this example, one column of the light-shielded pixels P2 is disposed in the region A21. The light-receiving section 13F includes a light-shielding film 24F and the light-shielding film 24. The light-shielding film 24F is provided in the region A2 (A21 and A22). The light-shielding film 24 is provided between the plurality of pixels P (the light-receiving pixels P1) in the region A1, and between the plurality of pixels P (the light-receiving pixels P3) in the region A3. The light-shielding film 24F is formed to have a larger thickness than the light-shielding film 24.

Here, the light-shielding film 24F corresponds to a specific example of a "light-shielding film" in the present disclosure. The light-shielding film 24 corresponds to a specific example of an "inter-pixel light-shielding film" in the present disclosure.

FIG. 13 illustrates an example of a light detection operation in the light-receiving section 13F. It is to be noted that FIG. 13 simply illustrates the light-receiving section 13F for convenience of description.

The light L1R reflected by the reflecting body 12 enters the light-receiving section 13F. Of the light L1R, light having entered the light-receiving element PD of the light-receiving pixel P1 is reflected by the light-shielding wall 27, thereby hindering leakage of the light L1R from the light-receiving pixel P1. In addition, for example, in a case where the light-shielding film 24F includes metal, the light-shielding film 24F is thick; therefore, partial light of the light L1R is reflected by a side surface of the light-shielding film 24F and enters the light-receiving element PD of the light-receiving pixel P1 in the region A1. This makes it possible for the light-receiving element PD of the light-receiving pixel P1 to effectively detect the light L1R. In addition, the light-receiving element PD of the light-shielded pixel P2 in the region A21 is light-shielded by the light-shielding wall 27 and the light-shielding film 24F; therefore, the light L1R does not enter the light-receiving element PD of the light-shielded pixel P2. In addition, the light-receiving pixel P1 that detects the light L1R and the light-receiving pixel P3 that detects the light L2 are separated from each other, which makes it possible to reduce a possibility that the light L1R enters the light-receiving element PD of the light-receiving pixel P3. This makes it possible for the distance measuring device 1F to reduce a possibility that the light-receiving pixel P3 in the region A3 detects the light L1R, thus making it possible to enhance measurement accuracy.

Meanwhile the light L2 reflected by the measurement object 100 enters the light-receiving section 13F. The light-receiving element PD of the light-receiving pixel P3 detects the light L2. The light-receiving element PD of the light-shielded pixel P2 in the region A21 is light-shielded by the light-shielding film 24F, which makes it possible to reduce a possibility that the light L2 enters the light-receiving element PD of the light-shielded pixel P2. In addition, the light-shielding film 24F is thick; therefore, a portion of the light L2 is blocked by the side surface of the light-shielding film 24F, which makes it possible to reduce a possibility that the light L2 enters the light-receiving element PD of the light-receiving pixel P1. This makes it possible for the distance measuring device 1F to reduce a possibility that the light-receiving pixel P1 in the region A1 detects the light L2, thus making it possible to enhance measurement accuracy.

Modification Example 6

In the embodiment described above, the distance to the measurement object 100 is measured by the direct method, but this is not limitative. Instead of this, for example, the distance to the measurement object 100 may be measured by an indirect method, for example. A distance measuring device 1H according to the present modification example includes the light-emitting section 11, the reflecting body 12, a light-receiving section 13H, and a processor 15H, as with the distance measuring device 1 (FIG. 1) according to the embodiment described above.

FIGS. 14A and 14B illustrate an example of a distance measurement operation in the distance measuring device 1H according to the present modification example, where FIG. 14A indicates the waveform of the light L0 emitted from the light-emitting section 11, and FIG. 14B indicates the waveform of the light L2 detected by the light-receiving section 13H.

The light-emitting section 11 emits the light L0 having a pulse waveform with a duty ratio of 50% on the basis of an instruction from the processor 15H FIG. 14A). The light L0 enters the reflecting body 12, and the light L1 having passed through the reflecting body 12 travels toward the measurement object 100. Then, the light L1 is reflected by the measurement object 100, and the reflected light L2 travels toward the light-receiving section 13H. Then, the light-receiving pixel P3 in the region A3 of the light-receiving section 13H detects the light L2 FIG. 14B). The light L2 detected by the light-receiving pixel P3 has a waveform delayed by a delay time DL with respect to the waveform of the light L0 illustrated in FIG. 14A. The delay time DL is a time in which light travels in order of the light-emitting section 11, the reflecting body 12, the measurement object 100, and the light-receiving section 13H, and corresponds to a flight time of light. The flight time of light corresponds to a distance between the distance measuring device 1H and the measurement object 100.

Meanwhile, the light L1R reflected by the reflecting body 12 travels toward the light-receiving section 13H. The light-receiving pixel P1 in the region A1 of the light-receiving section 13 detects the light L1R. The waveform of the light L1R detected by the light-receiving pixel P1 is substantially similar to the waveform of the light L0 illustrated in FIG. 14A, for example. In the indirect method, the light-receiving pixel P3 accumulates signal electric charges Q1 corresponding to an amount of light received by the light-receiving element PD in a period T1 in which the light-receiving pixel P1 detects light, and accumulates signal electric charges Q2 corresponding to the amount of light received by the light-receiving element PD in a period T2 in which the light-receiving pixel P1 does not detect light. Then, the processor 15H determines an electric charge ratio between the signal electric charges Q1 and the signal electric charges Q2. The light-receiving element PD receives the light L2 in the periods TA and TB; therefore, the electric charge amount of the signal electric charges Q1 is proportional to the length of the period TA, and the electric charge amount of the signal electric charges Q2 is proportional to the length of the period TB. In a case where the delay time DL is short, the signal electric charges Q1 are increased and the signal electric charges Q2 are decreased. In a case where the delay time DL is long, the signal electric charges Q1 are decreased, and the signal electric charges Q2 are increased. Thus, the electric charge ratio between the signal electric charges Q1 and the signal electric charges Q2 is changed depending on the delay time DL. In the indirect method, determining the electric charge ratio makes it possible to determine the delay time DL with high accuracy, for example. As a result, it is possible to measure the distance to the measurement object 100 with high accuracy.

Other Modification Examples

In addition, two or more of these modification examples may be combined.

2. Application Example to Mobile Body

The technology (the present technology) according to the present disclosure is applicable to various products. For example, the technology according to the present disclosure may be achieved as a device mounted on any type of mobile body such as an automobile, an electric vehicle, a hybrid electric vehicle, a motorcycle, a bicycle, a personal mobility, an airplane, a drone, a vessel, and a robot.

FIG. 15 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 15, the vehicle control system 12000 includes a driving system control unit 12010, a body system control unit

12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 15, an audio speaker 12061, a display section 12062, and an instrument panel 12063 are illustrated as the output device. The display section 12062 may, for example, include at least one of an on-board display and a head-up display.

FIG. 16 is a diagram depicting an example of the installation position of the imaging section 12031.

In FIG. 16, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 16 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure may be applied has been described above. The technology according to the present disclosure may be applied to the imaging section 12031 among the components described above. This makes it possible for the vehicle control system 12000 to enhance measurement accuracy in distance measurement, which makes it possible to enhance the accuracy of collision avoidance or shock mitigation for vehicles, a following driving function based on a following distance, a vehicle speed maintaining driving function, a warning function of collision of the vehicle, a warning function of deviation of the vehicle from a lane, and the like.

Although the present technology has been described above referring to some embodiments, the modification examples, and specific application examples thereof, the present technology is not limited to these embodiments and the like, and may be modified in a variety of ways.

For example, in the embodiments described above, the present technology is applied to the distance measuring device that measures the distance to the measurement object 100, but this is not limitative. Instead of this, for example, the present technology may be applied to a time measuring device that measures a flight time of light from emission of the light L0 by the light-emitting section to detection of the light L2 by the light-receiving section.

It is to be noted that the effects described herein are merely illustrative and non-limiting, and other effects may be provided.

It is to be noted that the present technology may have the following configurations. According to the present technology having the following configurations, it is possible to enhance image quality.

(1)

A distance measuring device including:

a light-receiving section including a first light-receiving pixel and a second light-receiving pixel that are configured to detect light, and a light-shielded pixel that is light-shielded, the first light-receiving pixel, the light-shielded pixel, and the second light-receiving pixel being disposed in a first direction in this order; and a processor that is configured to measure a distance to a measurement object on the basis of a detection result in the first light-receiving pixel and a detection result in the second light-receiving pixel.

(2)

The distance measuring device according to (1), in which the first light-receiving pixel, the light-shielded pixel, and the second light-receiving pixel each include a light-receiving element provided in a semiconductor substrate, and the light-receiving section includes, in the semiconductor substrate, a light-shielding wall provided between the light-receiving element of the first light-receiving pixel and the light-receiving element of the light-shielded pixel.

(3)
The distance measuring device according to (2), in which
a light-receiving surface of the light-receiving section is directed in a second direction intersecting with the first direction, and
the light-shielded pixel includes a light-shielding film provided in the second direction as compared with the semiconductor substrate.

(4)
The distance measuring device according to (3), in which
the light-receiving section further includes a third light-receiving pixel that is configured to detect light,
the first light-receiving pixel, the light-shielded pixel, the second light-receiving pixel, and the third light-receiving pixel are disposed in the first direction in this order,
the light-receiving section includes, between the second light-receiving pixel and the third light-receiving pixel, an inter-pixel light-shielding film provided in the second direction as compared with the semiconductor substrate, and
the light-shielding film is thicker than the inter-pixel light-shielding film.

(5)
The distance measuring device according to (2), in which
a light-receiving surface of the light-receiving section is directed in a second direction intersecting with the first direction, and
a height of the light-receiving element of the first light-receiving pixel in the second direction is smaller than a height of the light-receiving element of the second light-receiving pixel.

(6)
The distance measuring device according to (5), in which a width of the light-receiving element of the first light-receiving pixel in the first direction is larger than a width of the light-receiving element of the second light-receiving pixel.

(7)
The distance measuring device according to any one of (2) to (4), in which a width of the light-receiving element of the first light-receiving pixel in the first direction is different from a width of the light-receiving element of the second light-receiving pixel.

(8)
The distance measuring device according to any one of (2) to (4), in which
a light-receiving surface of the light-receiving section is directed in a second direction intersecting with the first direction, and
an impurity concentration gradient in the light-receiving element of the first light-receiving pixel in the second direction is different from an impurity concentration gradient in the light-receiving element of the second light-receiving pixel.

(9)
The distance measuring device according to any one of (1) to (8), further including: a light-emitting section that is configured to emit light, and has a light-emitting surface directed in a second direction intersecting with the first direction; and
a light guide member that guides a portion of the light emitted from the light-emitting section toward the first light-receiving pixel, in which
a distance between the first light-receiving pixel and the light-emitting section is shorter than a distance between the second light-receiving pixel and the light-emitting section, and
a light-receiving surface of the light-receiving section is directed in the second direction.

This application claims the benefit of Japanese Priority Patent Application JP2019-050071 filed with Japan Patent Office on Mar. 18, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A distance measuring device, comprising:
a light-receiving section that includes:
a semiconductor substrate;
a first light-receiving pixel;
a second light-receiving pixel;
a light-shielded pixel that is light-shielded, wherein
each of the first light-receiving pixel, the light-shielded pixel, and the second light-receiving pixel includes a light-receiving element in the semiconductor substrate,
each of the first light-receiving pixel and the second light-receiving pixel is configured to detect first light, and
the first light-receiving pixel, the light-shielded pixel, and the second light-receiving pixel are disposed in a first direction in this order; and
a light-shielding wall in the semiconductor substrate, wherein the light-shielding wall is between the light-receiving element of the first light-receiving pixel and the light-receiving element of the light-shielded pixel; and
a processor configured to measure a distance to a measurement object based on the detected first light.

2. The distance measuring device according to claim 1, wherein
a light-receiving surface of the light-receiving section is directed in a second direction that intersects with the first direction, and
the light-shielded pixel includes a light-shielding film in the second direction as compared with the semiconductor substrate.

3. The distance measuring device according to claim 2, wherein
the light-receiving section further includes a third light-receiving pixel,
the third light-receiving pixel is configured to detect the first light,
the first light-receiving pixel, the light-shielded pixel, the second light-receiving pixel, and the third light-receiving pixel are disposed in the first direction in this order,
the light-receiving section further includes, between the second light-receiving pixel and the third light-receiving pixel, an inter-pixel light-shielding film in the second direction as compared with the semiconductor substrate, and
the light-shielding film is thicker than the inter-pixel light-shielding film.

4. The distance measuring device according to claim 1, wherein
a light-receiving surface of the light-receiving section is directed in a second direction that intersects with the first direction, and a height of the light-receiving element of the first light-receiving pixel in the second direction is smaller than a height of the light-receiving element of the second light-receiving pixel.

5. The distance measuring device according to claim 4, wherein a width of the light-receiving element of the first light-receiving pixel in the first direction is larger than a width of the light-receiving element of the second light-receiving pixel.

6. The distance measuring device according to claim 1, wherein a width of the light-receiving element of the first light-receiving pixel in the first direction is different from a width of the light-receiving element of the second light-receiving pixel.

7. The distance measuring device according to claim 1, wherein
a light-receiving surface of the light-receiving section is directed in a second direction that intersects with the first direction, and
an impurity concentration gradient in the light-receiving element of the first light-receiving pixel in the second direction is different from an impurity concentration gradient in the light-receiving element of the second light-receiving pixel.

8. The distance measuring device according to claim 1, further comprising:
a light-emitting section configured to emit second light, wherein the light-emitting section has a light-emitting surface directed in a second direction that intersects with the first direction; and
a light guide member that guides a portion of the second light emitted from the light-emitting section toward the first light-receiving pixel, wherein
a distance between the first light-receiving pixel and the light-emitting section is shorter than a distance between the second light-receiving pixel and the light-emitting section, and
a light-receiving surface of the light-receiving section is directed in the second direction.

9. The distance measuring device according to claim 8, wherein
the first light-receiving pixel is further configured to detect the portion of the second light guided by the light guide member,
the second light-receiving pixel is further configured to detect third light reflected by the measurement object,
the first light corresponds to one of the second light or the third light, and
the processor is further configured to measure the distance to the measurement object based on:
the portion of the second light detected by the first light-receiving pixel, and
the third light detected by the second light-receiving pixel.

10. The distance measuring device according to claim 1, wherein
the light-receiving section further includes:
a plurality of light-shielded pixels, wherein the plurality of light-shielded pixels includes the light-shielded pixel, and
a trench between the plurality of light-shielded pixels, and
a depth of the light-shielding wall is larger than a depth of the trench.

11. The distance measuring device according to claim 1, wherein
the light-receiving section further includes a light-shielding film on a light-receiving surface of the semiconductor substrate, and
the light-shielded pixel is light-shielded by the light-shielding film and the light-shielding wall.

12. A distance measuring device, comprising:
a light-receiving section that includes:
a semiconductor substrate;
a first light-receiving pixel;
a second light-receiving pixel;
a light-shielded pixel;
a light-shielding film on a light-receiving surface of the semiconductor substrate;
a light-shielding wall between the first light-receiving pixel and the light-shielded pixel, wherein
the light-shielding film and the light-shielding wall light-shield the light-shielded pixel,
each of the first light-receiving pixel and the second light-receiving pixel is configured to detect light, and
the first light-receiving pixel, the light-shielded pixel, and the second light-receiving pixel are disposed in a first direction in this order; and
a processor configured to measure a distance to a measurement object based on the detected light.

* * * * *